(12) United States Patent
Kim et al.

(10) Patent No.: US 12,334,329 B2
(45) Date of Patent: Jun. 17, 2025

(54) SUBSTRATE PROCESSING METHOD

(71) Applicant: JUSUNG ENGINEERING CO., LTD., Gwangju-Si (KR)

(72) Inventors: Ji Hoon Kim, Gwangju-Si (KR); Chul Joo Hwang, Gwangju-Si (KR)

(73) Assignee: JUSUNG ENGINEERING CO., LTD. (KR)

( * ) Notice: Subject to any disclaimer, the term of this patent is extended or adjusted under 35 U.S.C. 154(b) by 0 days.

(21) Appl. No.: 18/265,234

(22) PCT Filed: Dec. 24, 2021

(86) PCT No.: PCT/KR2021/019884
§ 371 (c)(1),
(2) Date: Jun. 2, 2023

(87) PCT Pub. No.: WO2022/149777
PCT Pub. Date: Jul. 14, 2022

(65) Prior Publication Data
US 2024/0030022 A1    Jan. 25, 2024

(30) Foreign Application Priority Data
Jan. 6, 2021    (KR) .................. 10-2021-0001598

(51) Int. Cl.
*H01L 21/02* (2006.01)
*B08B 7/00* (2006.01)
*H01J 37/32* (2006.01)

(52) U.S. Cl.
CPC ...... *H01L 21/02049* (2013.01); *B08B 7/0035* (2013.01); *H01J 37/32449* (2013.01); *H01J 2237/335* (2013.01)

(58) Field of Classification Search
None
See application file for complete search history.

(56) References Cited

U.S. PATENT DOCUMENTS

| 2005/0156174 | A1 | 7/2005 | Murakami et al. |
| 2014/0004708 | A1 | 1/2014 | Thedjoisworo et al. |
| 2020/0399757 | A1 | 12/2020 | Hara et al. |

FOREIGN PATENT DOCUMENTS

| KR | 20030049086 A | 6/2003 |
| KR | 100707983 B1 | 4/2007 |

(Continued)

OTHER PUBLICATIONS

Translation of KR20180045977A (Year: 2024).*

(Continued)

*Primary Examiner* — Eric W Golightly
(74) *Attorney, Agent, or Firm* — Renaissance IP Law Group LLP

(57) ABSTRACT

The present disclosure relates to a substrate processing method, and more particularly, to a substrate processing method for removing an oxide film formed on a substrate. In accordance with an exemplary embodiment, a substrate processing method that processes a substrate loaded into a chamber, includes: supplying a nitrogen-containing gas to an inner space of a plasma generator disposed outside the chamber; activating the nitrogen-containing gas in the inner space; supplying a hydrogen-containing gas to the inner space; and supplying the nitrogen-containing gas activated in the inner space and the hydrogen-containing gas onto the substrate.

8 Claims, 2 Drawing Sheets

(56) References Cited

FOREIGN PATENT DOCUMENTS

| | | |
|---|---|---|
| KR | 20100112888 A | 10/2010 |
| KR | 20180045977 A | 5/2018 |
| TW | 202043527 A | 12/2020 |

OTHER PUBLICATIONS

International Search Report for PCT/KR2021/019884, mailed Apr. 11, 2022, 5 pages.
Written Opinion for PCT/KR2021/019884, mailed Apr. 11, 2022, 10 pages.

* cited by examiner

SUBSTRATE PROCESSING METHOD

TECHNICAL FIELD

The present disclosure relates to a substrate processing method, and more particularly, to a substrate processing method for removing an oxide film formed on a substrate.

BACKGROUND ART

In general, a semiconductor element or a display device is manufactured by depositing various materials on a substrate in the form of a thin-film and then pattering the thin-film.

However, when the substrate is exposed to the atmosphere while moving for each process, a natural oxide film is formed on the surface of the substrate due to oxygen or moisture. Since the natural oxide film has imperfect crystallinity, the natural oxide film has a film quality inferior to a silicon oxide film formed by thermal oxidation to cause various limitations such as connection instability and wiring resistance of the semiconductor element or the display device.

Typically, a wet cleaning process is performed in a separate device to remove the natural oxide film. Also, the substrate that has undergone the cleaning process is transferred to a substrate processing apparatus, and a substrate processing process such as thin-film deposition is performed on the substrate. However, when the natural oxide film is removed in the separate device for performing the wet cleaning process, a production cost is increased as the high price device is added. Also, since the natural oxide film is formed again on the surface of the substrate while the substrate that has undergone the cleaning process is transferred, resultantly, the natural oxide film may not be effectively removed.

SUMMARY

Technical Problem

The present disclosure provides a substrate processing method capable of effectively removing an oxide film formed on a substrate.

Technical Solution

In accordance with an exemplary embodiment, a substrate processing method that processes a substrate loaded into a chamber, includes: supplying a nitrogen-containing gas to an inner space of a plasma generator disposed outside the chamber; activating the nitrogen-containing gas in the inner space; supplying a hydrogen-containing gas to the inner space; and supplying the nitrogen-containing gas activated in the inner space and the hydrogen-containing gas onto the substrate.

The nitrogen-containing gas may include at least one of a $N_2$ gas and a $NH_3$ gas.

The hydrogen-containing gas may include a $H_2$ gas.

The supplying of the hydrogen-containing gas may supply the hydrogen-containing gas on a path through which the activated nitrogen-containing gas is moved into the chamber.

At least a portion of the hydrogen-containing gas supplied to the inner space may be activated on a path through which the activated nitrogen-containing gas is moved into the chamber.

The supplying gases onto the substrate may simultaneously supply the activated nitrogen-containing gas and the hydrogen-containing gas onto the substrate.

The substrate processing method may further include allowing the nitrogen-containing gas and the hydrogen-containing gas to react with an oxide film formed on the substrate to remove the oxide film.

The substrate processing method may further include supplying a fluorine-containing gas to the inner space.

The fluorine-containing gas may include at least one of a $F_2$ gas, a HF gas, and a $NF_3$ gas.

The supplying of the fluorine-containing gas may supply the fluorine-containing gas on a path through which the hydrogen-containing gas is moved to the chamber.

Advantageous Effects

The substrate processing method in accordance with an exemplary embodiment may quickly remove the natural oxide film formed on the substrate and reduce a process time by supplying, onto the substrate, the nitrogen-containing gas activated in the plasma generator disposed outside the chamber and the hydrogen-containing gas.

Also, as at least a portion of the hydrogen-containing gas supplied by using the activated nitrogen-containing gas is activated, the process gas reacting with the natural oxide film formed on the substrate may be generated to effectively remove the natural oxide film formed on the substrate.

DETAILED DESCRIPTION

Figure 1:
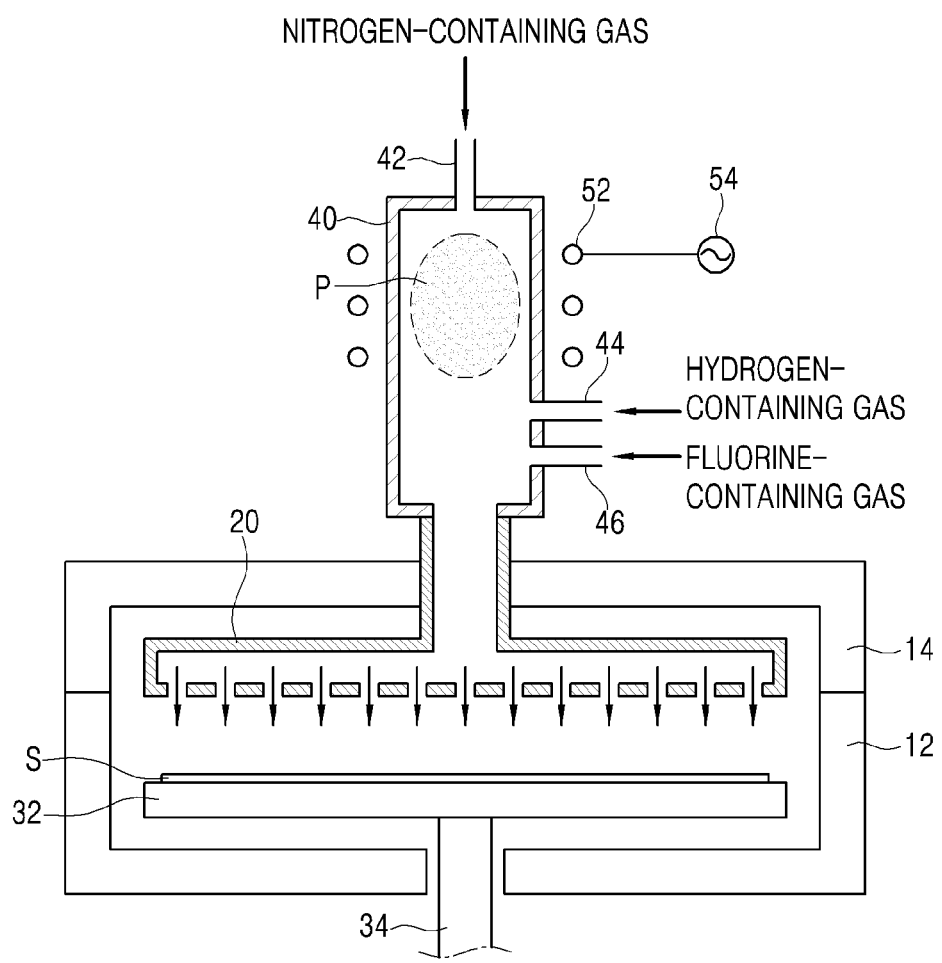
FIG. 1 is a schematic view illustrating a substrate processing apparatus in accordance with an exemplary embodiment.

Hereinafter, specific embodiments will be described in detail with reference to the accompanying drawings. The present invention may, however, be embodied in different forms and should not be construed as limited to the embodiments set forth herein. Rather, these embodiments are provided so that the present invention will be thorough and complete, and will fully convey the scope of the present invention to those skilled in the art. In the drawings, the thicknesses of layers and regions are exaggerated for clarity. In the figures, like reference numerals refer to like elements throughout.

FIG. 1 is a schematic view illustrating a substrate processing apparatus in accordance with an exemplary embodiment.

Referring to FIG. 1, a substrate processing apparatus for processing a substrate in accordance with an exemplary embodiment includes: a chamber 10, a substrate support unit 30 disposed in the chamber 10 to support a substrate S provided in the chamber 10; and a gas injection unit 20 disposed in the chamber 10 to face the substrate support unit 30 and injecting a process gas toward the substrate support unit 30. Also, the substrate processing apparatus may further include a plasma generator 40 connected to the gas injection unit 20 and disposed outside the chamber 10.

The chamber 10 provides a predetermined processing space and maintains sealing of the processing space. Also, the chamber 10 may include: a body 12 including a flat part having an approximately circular or rectangular shape and a sidewall part extending from the flat part in a vertical direction and having a predetermined processing space; and a cover 14 having an approximately circular or rectangular shape and disposed on the body 12 to seal the chamber 10. However, the exemplary embodiment is not limited to the shape of the chamber 10. For example, the chamber 10 may be manufactured into various shapes in correspondence to a shape of the substrate S.

An exhaust hole (not shown) may be formed in a predetermined area of a bottom surface of the chamber 10, and an exhaust pipe (not shown) connected with the exhaust hole may be disposed outside the chamber 10. Also, the exhaust pipe may be connected with an exhaust device (not shown). A vacuum pump may be used as the exhaust device. Thus, the inside of the chamber 10 may be vacuum suctioned by the exhaust device to a predetermined reduced-pressure atmosphere, e.g., a predetermined pressure of 0.1 mTorr or less. The exhaust pipe may be installed on a side surface of the chamber 10 below the substrate support unit 30 that will be described later in addition to the bottom surface of the chamber 10. Also, a plurality of exhaust pipes and exhaust devices connected thereto may be further installed to reduce a time for exhausting.

The substrate S provided in the chamber 10 for a substrate processing process, e.g., an oxide film removing process, may be seated on the substrate support unit 30. Here, the substrate S may be a substrate on which a thin-film is not formed or a substrate on which a predetermined thin-film is formed. Also, a predetermined structure such as a line may be formed on the substrate S. Here, a natural oxide film may be formed on the substrate. The natural oxide film may be formed, e.g., as the substrate S is exposed to the atmosphere. When the substrate S on which the natural oxide film is formed is loaded into the processing space of the chamber 10, the loaded substrate S may be seated on the substrate support unit 30. Here, the substrate support unit 30 may include an electrostatic chuck to absorb and maintain the substrate S by using an electrostatic force so that the substrate S is seated and supported or may support the substrate S by using vacuum absorption or a mechanical force.

The substrate support unit 30 may have a shape corresponding to that of the substrate S, e.g., a circular shape or a rectangular shape. The substrate support unit 30 may include a substrate support 32 on which the substrate S is seated and an elevator 34 disposed below the substrate support 32 to move the substrate support 32 in a vertical direction. Here, the substrate support 32 may be manufactured larger than the substrate S, and the elevator 34 may support at least one area, e.g., a central portion, of the substrate support 32 and move the substrate support 32 to be adjacent to the gas injection unit 20 when the substrate S is seated on the substrate support 32. Also, a heater (not shown) may be installed in the substrate support 32. The heater generates heat at a predetermined temperature to heat the substrate support and the substrate S seated on the substrate support, so that a thin-film is uniformly deposited on the substrate S.

The gas injection unit 20 is disposed at an inner upper side of the chamber 10 and injects a process gas toward the substrate. The gas injection unit 20 may have a predetermined inner space. The gas injection unit 20 may have an upper portion connected to the plasma generator 40 and a lower portion in which a plurality of injection holes for injecting the process gas onto the substrate S are defined. The gas injection unit 20 may have a shape corresponding to that of the substrate S, e.g., an approximately circular or rectangular shape. Here, the gas injection unit 20 may be spaced a predetermined distance from the sidewall part and the cover 14 of the chamber 10.

The plasma generator 40 may be installed outside the chamber 10 and have a predetermined inner space. The inner space of the plasma generator 40 communicates with the processing space of the chamber. The plasma generator 40 receives the process gas to activate the process gas in the inner space and provides the activated process gas to the gas injection unit 20. The activated process gas provided to the gas injection unit 20 is injected through the injection holes and supplied onto the substrate S.

An antenna part 52 surrounds at least a portion of the inner space of the plasma generator 40. That is, the antenna part 52 is disposed outside the plasma generator 40 to surround an upper portion of the inner space of the plasma generator 40 extending in the vertical direction. The antenna part 52 may receive an electric power from a RF power 54 and generate plasma P at an upper portion of the inner space by an inductively coupled plasma (ICP) method. Here, the antenna part 52 may have one end connected to the RF power 54 and the other end connected to the ground.

A plurality of process gas supply pipes are installed in the plasma generator 40, and the process gas supplied through the process gas supply pipes is introduced into the inner space of the plasma generator 40. For example, a first process gas supply pipe 42 and a second process gas supply pipe 44 may be installed in the plasma generator 40. In addition to this, a third process gas supply pipe 46 may be installed in the plasma generator 40.

The first process gas supply pipe 42 may be installed at an upper end of the plasma generator 40 and supply the process gas to the inner space of the plasma generator 40. Here, the process gas supplied from the first process gas supply pipe 42 may be a nitrogen-containing gas, and the nitrogen-containing gas may include at least one of a $N_2$ gas and $NH_3$ gas. The nitrogen-containing gas supplied from the first process gas supply pipe 42 is activated at the upper portion of the inner space surrounded by the antenna part 52, and the activated nitrogen-containing gas is supplied to the processing space in the chamber 10 through a lower portion of the inner space.

The second process gas supply pipe 44 may be installed at a side portion of the plasma generator 40 and supply the process gas to the inner space of the plasma generator 40. Here, the process gas supplied from the second process gas supply pipe 44 may be a hydrogen-containing gas, and the hydrogen-containing gas may include a $H_2$ gas. The second process gas supply pipe 44 may be disposed below the antenna part 52 and supply the hydrogen-containing gas to the inner space of the plasma generator 40. That is, the second process gas supply pipe 44 may supply the hydrogen-containing gas to the lower portion of the inner space, and through this, the second process gas supply pipe 44 may supply the hydrogen-containing gas on a path through which the nitrogen-containing gas activated by the antenna part 52 is moved to the processing space of the chamber 10.

The third process gas supply pipe 46 may be installed at a side portion of the plasma generator 40 and supply the process gas to the inner space of the plasma generator 40. The process gas supplied from the third process gas supply pipe 46 may be a fluorine-containing gas, and the fluorine-containing gas may include at least one of a $F_2$ gas, a HF gas, and a $NF_3$ gas. Here, the third process gas supply pipe 46 may be disposed below the second process gas supply pipe 44 and supply the fluorine-containing gas to the inner space of the plasma generator 40. That is, the third process gas supply pipe 46 may supply the fluorine-containing gas to a lowermost portion of the inner space, and through this, the third process gas supply pipe 46 may supply the fluorine-containing gas on a path through which the hydrogen-containing gas supplied through the second process gas supply pipe 44 is moved to the processing space of the chamber 10.

Hereinafter, a substrate processing method in accordance with an exemplary embodiment will be described in detail with reference to FIG. 2. When the substrate processing method in accordance with an exemplary embodiment is described, a description overlapped with the above-described description on the substrate processing apparatus will be omitted.

Figure 2:
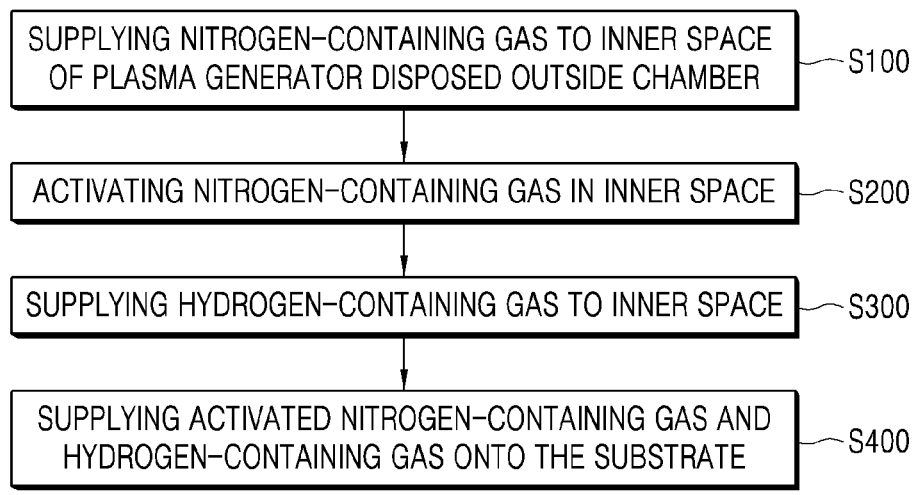
FIG. 2 is a schematic flowchart representing a substrate processing method in accordance with an exemplary embodiment.

FIG. 2 is a schematic flowchart representing the substrate processing method in accordance with an exemplary embodiment.

Referring to FIG. 2, the substrate processing method in accordance with an exemplary embodiment, which is the substrate processing method for processing a substrate S loaded into a chamber 10, includes: a process S100 of supplying a nitrogen-containing gas to an inner space of a plasma generator 40 disposed outside the chamber 10; a process S200 of activating the nitrogen-containing gas in the inner space; a process S300 of supplying a hydrogen-containing gas to the inner space; and a process S400 of supplying the nitrogen-containing gas activated in the inner space and the hydrogen-containing gas onto the substrate S.

Here, the substrate processing method in accordance with an exemplary embodiment, which is the substrate processing method for processing the substrate S loaded into the chamber 10, may remove an oxide film formed on the substrate S, i.e., a natural oxide film formed as the substrate is exposed to the atmosphere.

Here, loading of the substrate S may be performed by loading the substrate S into the processing space of the chamber 10. Here, the substrate S loaded into the processing space may be seated on a substrate support unit 30. Here, the substrate support unit 30 may include an electrostatic chuck to absorb and maintain the substrate S by using an electrostatic force so that the substrate S is seated and supported or may support the substrate S by using vacuum absorption or a mechanical force, which is previously described.

The process S100 of supplying the nitrogen-containing gas supplies the nitrogen-containing gas to the inner space of the plasma generator 40 disposed outside the chamber 10. That is, the plasma generator 40 may be installed outside the chamber 10 and have a predetermined inner space communicating with the processing space of the chamber 10.

The process S100 of supplying the nitrogen-containing gas is performed by supplying the nitrogen-containing gas to the inner space of the plasma generator 40 from a first process gas supply pipe 42 installed at an upper end of the plasma generator 40. Here, the nitrogen-containing gas may include at least one of a $N_2$ gas and a $NH_3$ gas.

The process S200 of activating the nitrogen-containing gas activates the nitrogen-containing gas in the inner space of the plasma generator 40. As described above, an antenna part 52 may be disposed outside the plasma generator 40 to surround an upper portion of the inner space of the plasma generator 40 extending in the vertical direction. Thus, the nitrogen-containing gas supplied from the first process gas supply pipe 42 to the upper end of the plasma generator 40 may be activated at the upper portion of the inner space surrounded by the antenna part 52 to generate plasma P. Through this, for example, the $N_2$ gas may be activated into ions or radicals of N and $N_2$ at the upper portion of the inner space, and the $NH_3$ gas may be activated into ions or radicals of N, H, NH, $NH_2$, and $NH_3$ at the upper portion of the inner space.

The process S300 of activating the hydrogen-containing gas supplies the hydrogen-containing gas to the inner space of the plasma generator 40. That is, the process S300 of activating the hydrogen-containing gas is performed by supplying the hydrogen-containing gas to the inner space of the plasma generator 40 from a second process gas supply pipe 44 installed at the side portion of the plasma generator 40. Here, the hydrogen-containing gas may include a $H_2$ gas.

As described above, the second process gas supply pipe 44 may be disposed below the antenna part 52 and supply the hydrogen-containing gas to the inner space of the plasma generator 40. That is, the process S300 of activating the hydrogen-containing gas may supply the hydrogen-containing gas on a path through which the activated nitrogen-containing gas is moved into the chamber 10. Thus, at least a portion of the hydrogen-containing gas supplied into the inner space in the process S300 of activating the hydrogen-containing gas may be activated on the path through which the activated nitrogen-containing gas is moved into the chamber 10. That is, at least a portion of the $H_2$ gas may be activated into ions or radicals of H and $H_2$ by the activated nitrogen-containing gas, and the hydrogen-containing gas activated as described above may react with the activated nitrogen-containing gas to form various N—H bondings.

Here, the substrate processing method in accordance with an exemplary embodiment may further include a process of supplying a fluorine-containing gas to the inner space.

The process of supplying the fluorine-containing gas supplies the fluorine-containing gas to the inner space of the plasma generator 40. That is, the process of supplying the fluorine-containing gas is performed by supplying the fluorine-containing gas to the inner space of the plasma generator 40 from a third process gas supply pipe 46 installed at the side portion of the plasma generator 40. Here, the fluorine-containing gas may include at least one of a $F_2$ gas, a HF gas, and a $NF_3$ gas.

As described above, the third process gas supply pipe 46 may be disposed below the second process gas supply pipe 44 and supply the fluorine-containing gas to the inner space of the plasma generator 40. That is, the process of supplying the fluorine-containing gas may supply the fluorine-containing gas on a path through which the hydrogen-containing gas is moved into the chamber 10. Thus, at least a portion of the fluorine-containing gas supplied into the inner space in the process of supplying the fluorine-containing gas may be activated on the path through which the at least partially activated hydrogen-containing gas is moved into the chamber 10. That is, at least a portion of the $F_2$ gas may be activated into ions or radicals of F and $F_2$ by the at least partially activated hydrogen-containing gas, at least a portion of the HF gas may be activated into ions or radicals of H and HF by the at least partially activated hydrogen-containing gas, and at least a portion of the $NF_3$ gas may be activated into ions or radicals of N, F, NF, $NF_2$, and $NF_3$ by the at least partially activated hydrogen-containing gas. The fluorine-containing gas activated as described above may react with at least one of the activated nitrogen-containing gas and the hydrogen-containing gas to form various bondings.

The process S400 of supplying gases onto the substrate S supplies the nitrogen-containing gas activated in the inner space of the plasma generator 40 and the hydrogen-containing gas onto the substrate S. Since the inner space of the plasma generator 40 communicates with the processing space of the chamber 10, the nitrogen-containing gas activated in the inner space of the plasma generator 40 and the hydrogen-containing gas are supplied to a gas injection unit 20 and provided onto the substrate S through injection holes.

Here, the process S400 of supplying gases onto the substrate S may simultaneously supply the activated nitrogen-containing gas and the hydrogen-containing gas onto the substrate S. Also, when a process of supplying the fluorine-containing gas into the inner space is further included, the process S400 of supplying gases onto the substrate S may simultaneously supply the activated nitrogen-containing gas and the hydrogen-containing gas onto the substrate S. Here, as at least a portion of the activated nitrogen-containing gas, the hydrogen-containing gas, and the fluorine-containing gas may react with each other, the reacted gases may be supplied onto the substrate S instead of being separately supplied.

As described above, when the activated nitrogen-containing gas and the hydrogen-containing gas or the activated nitrogen-containing gas, the hydrogen-containing gas, and the fluorine-containing gas are supplied onto the substrate S, the gases react with an oxide film formed on the substrate S to remove the natural oxide film formed on the substrate S. Here, water vapor ($H_2O$) produced as the gases supplied onto the substrate S react with the natural oxide film and unreacted residual gases may be discharged to the outside of the chamber 10 by an exhaust unit.

The substrate processing method in accordance with an exemplary embodiment may quickly remove the natural oxide film formed on the substrate and reduce a process time by supplying, onto the substrate, the nitrogen-containing gas activated in the plasma generator disposed outside the chamber and the hydrogen-containing gas.

Also, as at least a portion of the hydrogen-containing gas supplied by using the activated nitrogen-containing gas is activated, the process gas reacting with the natural oxide film formed on the substrate may be generated to effectively remove the natural oxide film formed on the substrate.

Although the embodiments of the present invention have been described, it is understood that the present invention should not be limited to these embodiments but various changes and modifications can be made by one ordinary skilled in the art within the spirit and scope of the present invention as hereinafter claimed. Therefore, it should be understood that simple modifications according to the embodiments of the present invention may belong to the technical spirit of the present invention.

What is claimed is:

1. A substrate processing method that processes a substrate loaded into a chamber, comprising:
   supplying a nitrogen-containing gas to an inner space of a plasma generator disposed outside the chamber;
   activating the nitrogen-containing gas in the inner space;
   supplying a hydrogen-containing gas to the inner space; and
   supplying the nitrogen-containing gas activated in the inner space and the hydrogen-containing gas onto the substrate;
   wherein the supplying of the hydrogen-containing gas supplies the hydrogen-containing gas on a path through which the activated nitrogen-containing gas is moved into the chamber,
   wherein at least a portion of the hydrogen-containing gas supplied to the inner space is activated by the activated nitrogen-containing gas on the path through which the activated nitrogen-containing gas is moved into the chamber.

2. The substrate processing method of claim 1, wherein the nitrogen-containing gas comprises at least one of a N2 gas and a NH3 gas.

3. The substrate processing method of claim 1, wherein the hydrogen-containing gas comprises a H2 gas.

4. The substrate processing method of claim 1, wherein the supplying gases onto the substrate simultaneously supplies the activated nitrogen-containing gas and the hydrogen-containing gas onto the substrate.

5. The substrate processing method of claim 1, further comprising allowing the nitrogen-containing gas and the hydrogen-containing gas to react with an oxide film formed on the substrate to remove the oxide film.

6. The substrate processing method of claim 1, further comprising supplying a fluorine-containing gas to the inner space.

7. The substrate processing method of claim 6, wherein the fluorine-containing gas comprises at least one of a F2 gas, a HF gas, and a NF3 gas.

8. The substrate processing method of claim 6, wherein the supplying of the fluorine-containing gas supplies the fluorine-containing gas on a path through which the hydrogen-containing gas is moved to the chamber.

* * * * *